(12) United States Patent
Kosaka

(10) Patent No.: US 8,563,433 B2
(45) Date of Patent: Oct. 22, 2013

(54) PROCESS TO FORM VIA HOLE IN SEMICONDUCTOR WAFER

(75) Inventor: Toshiyuki Kosaka, Yokohama (JP)

(73) Assignee: Sumitomo Electric Device Innovations, Inc., Kanagawa (JP)

( * ) Notice: Subject to any disclaimer, the term of this patent is extended or adjusted under 35 U.S.C. 154(b) by 160 days.

(21) Appl. No.: 13/188,569

(22) Filed: Jul. 22, 2011

(65) Prior Publication Data

US 2012/0028465 A1    Feb. 2, 2012

(30) Foreign Application Priority Data

Jul. 30, 2010   (JP) .................................. 2010-172171

(51) Int. Cl.
  *H01L 21/44*  (2006.01)

(52) U.S. Cl.
  USPC .... 438/674; 438/945; 438/678; 257/E21.023; 257/E21.232

(58) Field of Classification Search
  USPC .................. 438/674, 678, 945; 257/E21.023, 257/E21.232
  See application file for complete search history.

(56) References Cited

U.S. PATENT DOCUMENTS

2005/0032362 A1* 2/2005 Cohen et al. .................. 438/658
2008/0153287 A1* 6/2008 Jeong ........................... 438/669

FOREIGN PATENT DOCUMENTS

JP           2008-98456         4/2008

* cited by examiner

*Primary Examiner* — Michelle Mandala
(74) *Attorney, Agent, or Firm* — Smith, Gambrell & Russell, LLP

(57) ABSTRACT

A process to form a via hole in a semiconductor wafer is disclosed. The process includes steps of, preparing a metal mask and etching the wafer by the metal mask as the etching mask. The preparation of the metal mask includes steps of: coating a nega-resist on the back surface of the wafer, carrying out the photolithography for the coated nega-resist, plating a metal selectively by the patterned photoresist, and removing the patterned photoresist.

15 Claims, 10 Drawing Sheets

PROCESS TO FORM VIA HOLE IN SEMICONDUCTOR WAFER

BACKGROUND OF THE INVENTION

1. Field of the Invention

The present invention relates to a method to manufacture a semiconductor device.

2. Related Prior Art

In a process to etch a slab material such as a semiconductor wafer made of silicon carbide (SiC), or a semiconductor layer disposed on the slab material, a mask layer is first prepared on the slab material as an etching mask. The mask material preferably shows an etching rate substantially greater than that of the slab material, which is ordinarily called as the selective ratio, so as not to vanish during the etching. A metal mask generally shows a large selective ratio, namely, a considerably small etching rate. A Japanese Patent published as JP-2008-098456A has disclosed a method to etch the SiC wafer selectively by using a metal mask.

The metal mask may be preferably prepared by plating. Specifically, Coating a positive resist on a whole surface of the slab material first; then patterning the coated resist by an ordinal photolithography technique, finally, a metal may be formed on portions not covered by the patterned resist. Removing the resist, the metal mask may be obtained.

However, the positive photoresist inherently has a characteristic that an irradiated portion is removed by the development. Accordingly, when the positive photoresist is coated in thick, the photolithography process often shows, so called, the under exposure failure, which leaves a residual resist that strongly influences the quality of subsequently carried out processes.

SUMMARY OF THE INVENTION

An aspect of the present invention relates to a process to form a via hole in a semiconductor wafer. The process may include steps of: (a) preparing a metal mask by steps of; (a-1) coating a negative photoresist on a back surface of the wafer, (a-2) performing a photolithography procedure to the coated negative photoresist, (a-3) plating a metal selectively by the patterned negative photoresist, (a-4) removing the patterned negative photoresist, and (b) etching the semiconductor wafer by the selectively plated metal as an etching mask to form the via hole.

A feature of the semiconductor process according to one of the embodiments of the invention is that the negative photoresist is first coated on the semiconductor wafer. The negative photoresist has a characteristic that portions not irradiated by light have solubility for a developer. Accordingly, even if the negative photoresist is coated in thick, the process may leave no residual resist by the underexposure.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, some preferred embodiments according to the present invention will be described. In the description of the drawings, the same numerals or the symbols will refer to the same elements without duplicating explanations.

A semiconductor process described below relates to a process to form a metal interconnection on the surface of the semiconductor wafer, which is typically made of silicon carbide (SiC), after a via hole is formed in the wafer. FIGS. 1A to 5 show cross sections of the semiconductor device during respective process steps according to an embodiment of the invention.

Figure 1A:
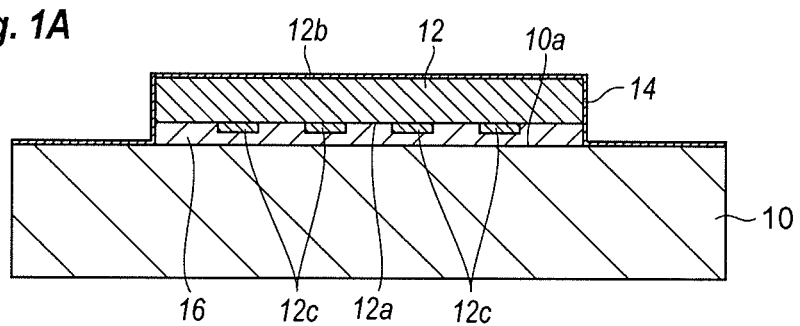
FIGS. 1A to 1C show cross sections of a semiconductor device during the process thereof according to an embodiment of the present invention.

First, the process puts the semiconductor wafer 12 on the surface 10a of the support substrate 10, as shown in FIG. 1A. Setting the primary surface 12a of the semiconductor wafer 12 so as to face the primary surface 10a of the support substrate 10, an adhesive 16 made of resin is put between the wafer 12 and the substrate 10. The resin adhesive has a thickness of about 10 μm; while, the support substrate 10 is made of glass such as sapphire ($Al_2O_3$), silica ($SiO_2$), or SiC. The support substrate 10 has the primary surface 10a thereof wider than the primary surface 12a of the wafer 12; and has a thickness enough greater than that of the wafer 12. That is, the whole primary surface 12a of the wafer 12 is attached to the primary surface 10a of the support substrate 10.

The wafer 12, which is a subject having a plane shape to be processed in the present invention, may be made of Si, SiC, sapphire, silica, or gallium nitride (GaN). The wafer has a thickness of about 100 μm. The primary surface 12a thereof has a layer structure for the semiconductor active device and interconnections 12c electrically connected to the active device where they are formed in advance to the process described below.

Next, the process forms a seed metal film 14 not only on the back surface 12b of the wafer 12 but on the primary surface 10a of the substrate 10. The seed metal film 14 may be a multi-layered metal of NiCr/Au or Ti/Au stacked in this order.

Figure 1B:
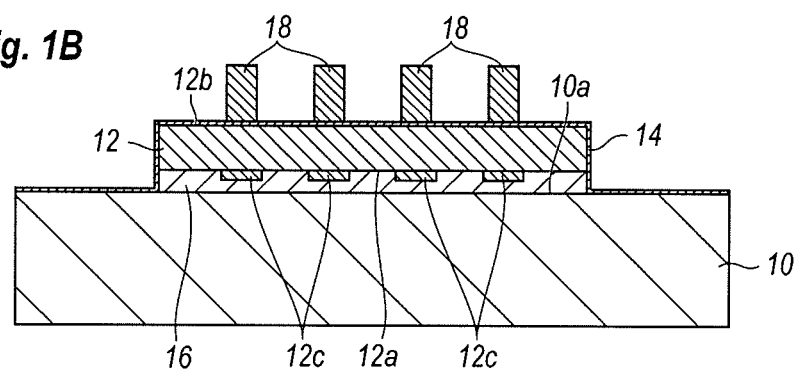

Subsequently, the process forms a patterned resist 18 on the seed metal film 14. Specifically, the process first coats a negative type resist on the seed metal film 14 including on the whole back surface 12b of the wafer 12 and the primary surface 10a of the substrate 10. Carrying out the exposure of the photo-resist through a photo-mask having preset patterns, a portion of the photo resist irradiated by the light through the photo mask hardens. The preset patterns correspond to via holes to be formed in the wafer 10. Thus, the resist pattern 18 may be formed as shown in FIG. 1B.

Figure 1C:
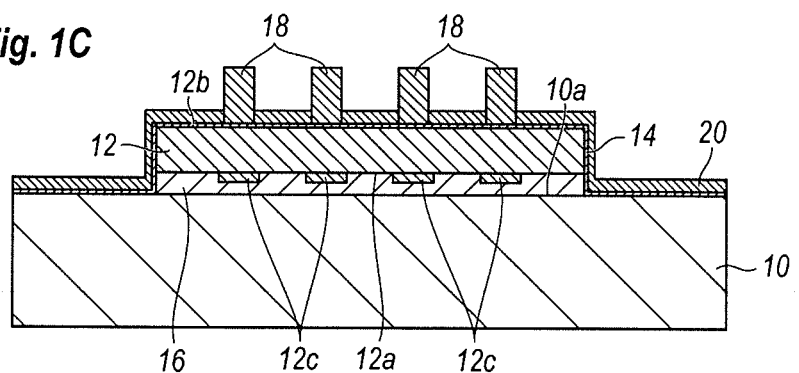
Figure 2A:
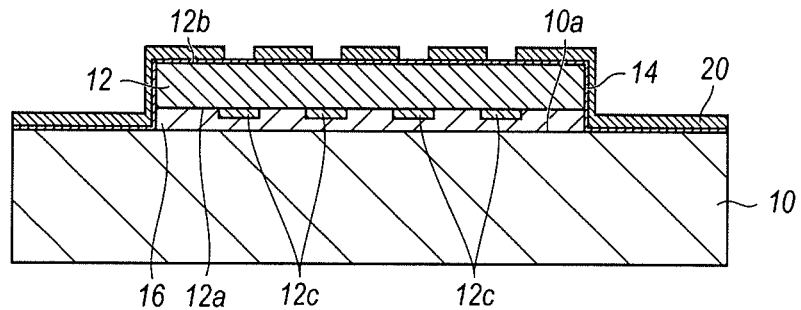
FIGS. 2A to 2C show cross sections of the semiconductor device during the process thereof subsequent to that shown in FIG. 1C.
Figure 2B:
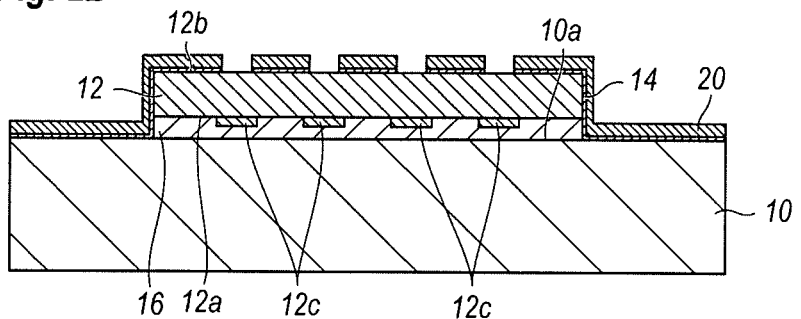

Next, a metal film 20 is formed by the plating on the seed metal film 14 exposed between the resist patterns 18, as shown in FIG. 1C. Removing the resist patter 18, the metal mask is prepared as shown in FIG. 2A. The metal mask 20 may contain at least nickel (Ni), chrome (Cr), or copper (Cu). The present embodiment prepares the metal mask 20 made of Ni. As shown in FIG. 2A the metal mask 20 may be formed in areas on the seed metal film 14 exposed between the patterned resist 18. The metal mask 20 also covers the primary surface 10a of the substrate 10. After removing the resist pattern 18, the process removes the seed metal film 14 covered by the patterned resist 18 and currently exposed between metal masks 20 (FIG. 2B)

Figure 2C:
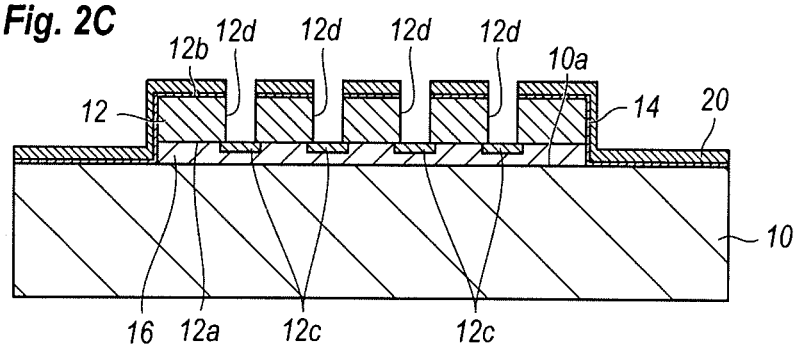

The process next etches the semiconductor wafer 10 by the metal mask 20 as an etching mask, which forms the via holes 12d, as shown in FIG. 2C. The etching may be carried out by the inductively coupled plasma (ICP) etching, or by electron cyclotron resonance (ECR) plasma etching. For the ICP etching, the following conditions are preferably applied:

| | |
|---|---|
| etching gas | mixture of $NF_3$ with $O_2$, or $SF_6$ with $O_2$ |
| pressure | 0.5-2.0 Pa |
| ICP power | greater than 2 kW |
| RF power | 150-500 W. |

When the ECR etching is applied, the ECR power is preferably greater than 1500 W, and the other conditions are substantially same as those of the ICP etching.

Figure 3A:
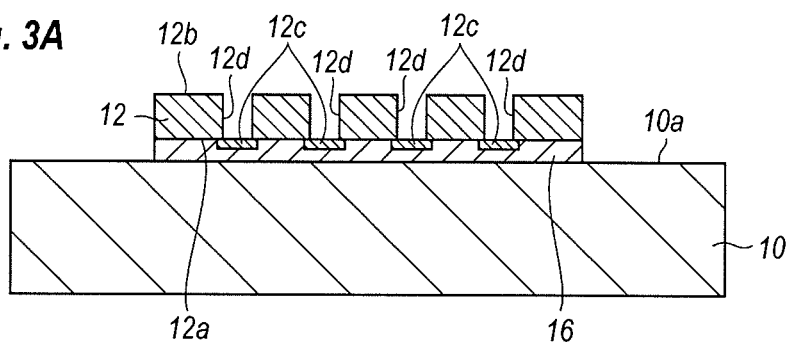
FIGS. 3A to 3C show cross sections of the semiconductor device during the process thereof subsequent to that shown in FIG. 2C.
Figure 3B:
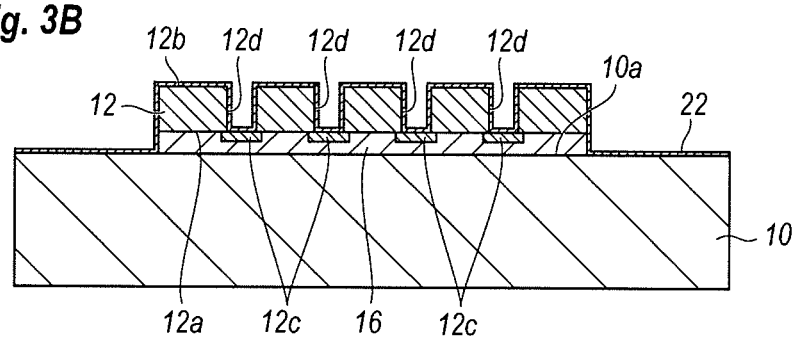

Next, the process removes the metal mask 20 as shown in FIG. 3A, and forms another seed metal film 22 on the back surface 12b of the wafer 12 and inner surfaces of the via hole 12d, as shown in FIG. 3B. The other seed metal film 22 is deposited also on the primary surface 10a of the substrate 10. The other seed metal 22 may show the same function with those of the aforementioned seed metal film 14.

Figure 3C:
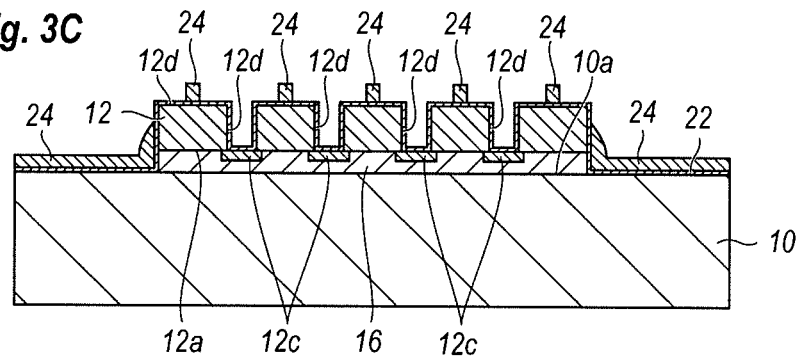

Subsequently, the process prepares the second resist pattern 24 on the back surface 12b of the wafer 12. The second resist may be a positive photoresist. Specifically, the process first coats the whole back surface 12b of the wafer 12 and the whole primary surface 10a of the substrate 10 with a positive photoresist. Carrying out the exposure of the positive photoresist through a photo-mask, a portion of the positive photoresist irradiated with the light through the photo-mask increases the solubility for a developer, and may be removed by a subsequent developing. Then, the resist pattern 24 for the interconnection may be prepared, as shown in FIG. 3C.

Figure 4A:
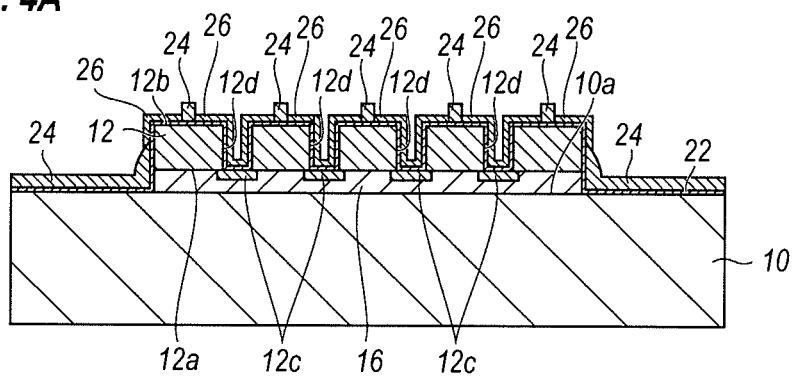
FIGS. 4A to 4C show cross sections of the semiconductor device during the process thereof subsequent to that shown in FIG. 3C.
Figure 4B:
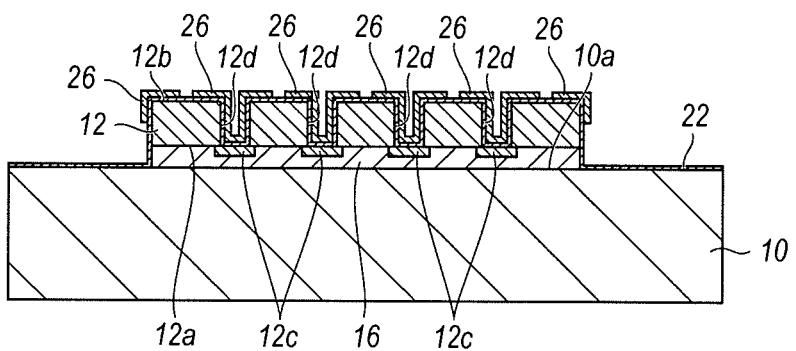
Figure 4C:
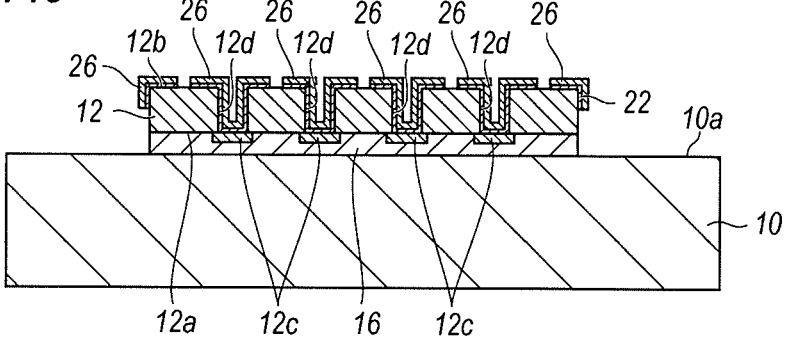

Plating the back surface 12b of the wafer 12 with a metal 26, as shown in FIG. 4A, and removing the resist pattern 24, as shown in FIG. 4B, the back metal 26 may be formed. The back metal 26 may contain gold (Au) or gold alloy and formed in areas except for areas where the resist patters 24 are formed. Thus, the back metal 26 is formed within the via hole 12d and on the back surface 12a of the wafer 12. Subsequently, the process removes the seed metal film 22 covered by the resist pattern 24 but currently exposed between back metals 26, as shown in FIG. 4C.

Figure 5:
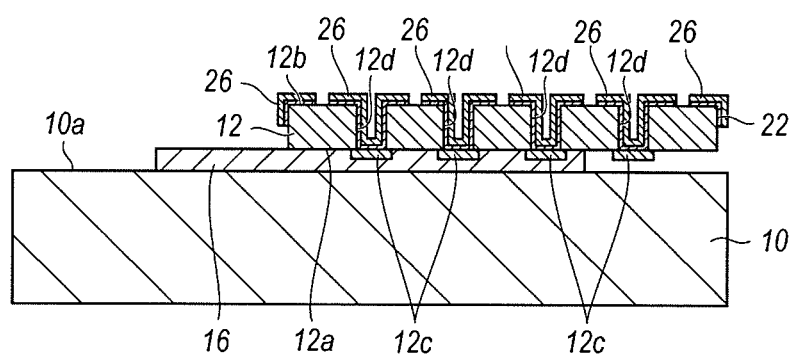
FIG. 5 shows a cross section of the semiconductor device during the process thereof subsequent to that shown in FIG. 4C.

Finally, the process detaches the semiconductor wafer 12 from the support substrate 10, which is shown in FIG. 5. Specifically, heating the substrate 10 to soften the resin adhesive 16, then sliding the wafer 12 along the surface of the substrate 10, the wafer 12 may be detached from the substrate 10.

The process thus described will be compared with one of comparative process shown in FIGS. 6A to 10.

The comparative process first attaches a semiconductor wafer 112 to a primary surface 110a of a support substrate 110, as shown in FIG. 6, which is substantially same as those of aforementioned embodiment according to the present invention; that is, a resin adhesive is put between the wafer 112 and the substrate 110. Then, the comparative process forms a seed metal film 114 on the back surface 112b of the wafer 112 and the front surface 110a of the substrate 110.

Figure 6A:
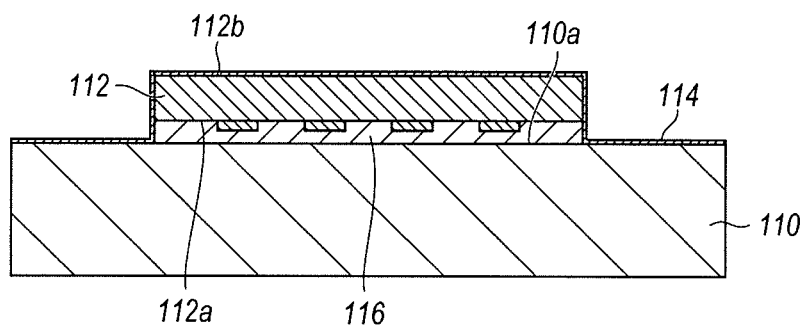
FIGS. 6A to 6C show cross sections of a semiconductor device during a comparative process.
Figure 6B:
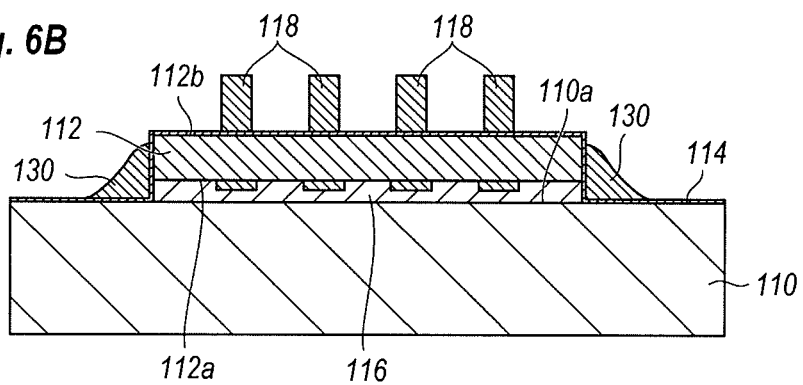
Figure 6C:
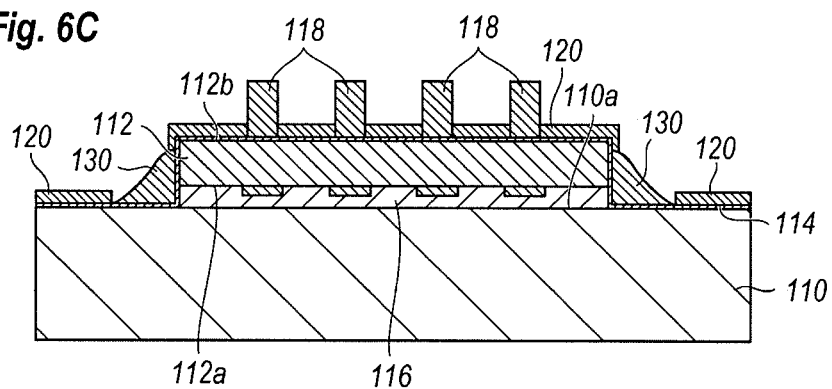

Next, the comparative process forms a resist pattern 118 on the back surface 112b of the wafer 112 for preparing the metal mask. Specifically, the comparable process first coats the whole back surface 112b of the wafer 112 with a positive photoresist by, for instance, spin-coating. Because of a step at the edge of the wafer 112, the positive photoresist 14 is formed in thick at the edge portion of the wafer 112. Carrying out the exposure for the positive photoresist through a photo-mask with preset patterns, a portion of the positive photoresist irradiated by the light through the photo-mask increases the solubility for a developer; then, developing the positive photoresist to remove the irradiated portions thereof, the resist pattern 118 may be prepared as shown in FIG. 6B.

However, as described above, the periphery of the wafer 112 has the step, where the resist is coated thereat in thick compared to those in other portions. Accordingly, the peripheral portion of the wafer 112 causes the underexposure; then, the development of the positive photoresist often leaves a residue 130 along the periphery of the wafer 112, as shown in FIG. 6B.

Figure 7A:
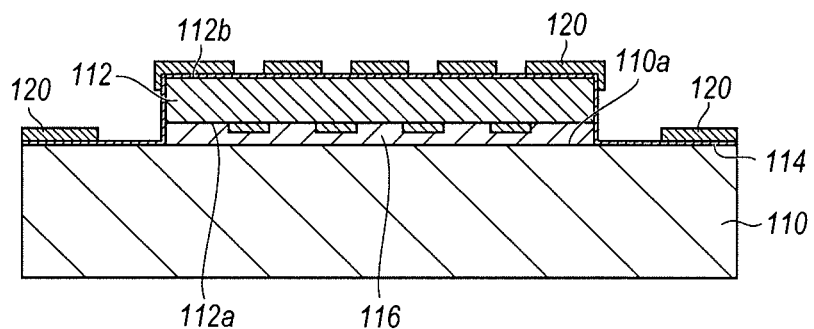
FIGS. 7A to 7C show cross sections of the semiconductor device during the comparative process subsequent to that shown in FIG. 6C.
Figure 7B:
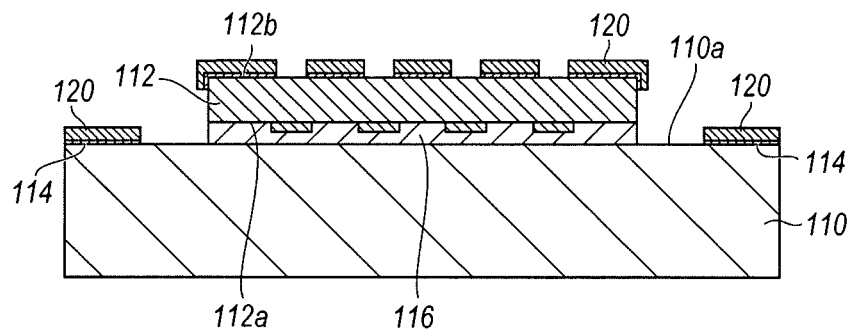
Figure 7C:
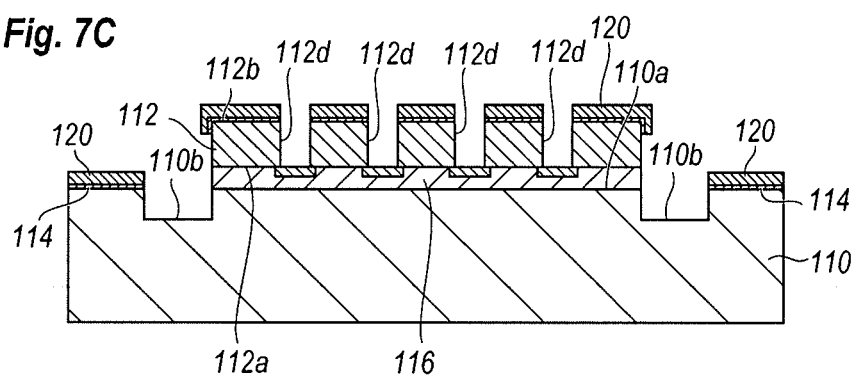

The comparative process proceeds the metal plating to form the metal mask 120 on the back surface 112b of the wafer 112 (FIG. 6C); and removes the positive photoresist (FIG. 7A). Carrying out the same procedures according to the embodiment of the invention described above after removing the positive photoresist shown in FIG. 7A, no metal mask 120 may be left in the periphery of the wafer 112 because the resist residue 130 is removed from these regions. As shown in FIG. 7B, the seed metal film 114 is removed in portion covered by the positive photoresist patterns 118 and now exposed between metal masks 120. Because the seed metal film 140 on the primary surface 10a of the substrate 10 is also removed, a portion 110a of the substrate 110 in a periphery of the wafer 112 is exposed (FIG. 7B).

Etching the wafer 112 to form via holes 112d, the peripheral portion 110a where the surface thereof is exposed is also etched so as to form a groove 110b. The etching apparatus and the conditions thereof are the same as those aforementioned.

Figure 8A:
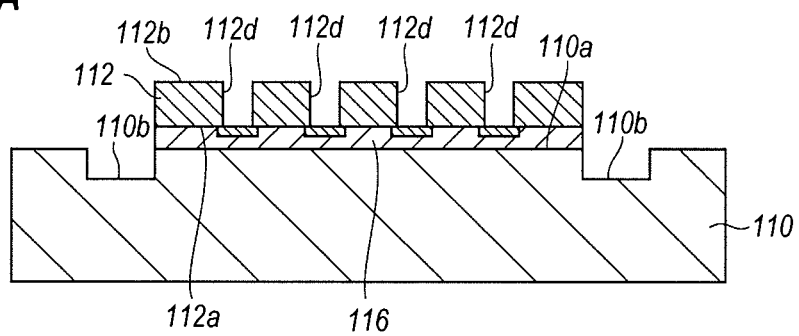
FIGS. 8A to 8C show cross sections of the semiconductor device during the comparative process subsequent to that shown in FIG. 7C.
Figure 8B:
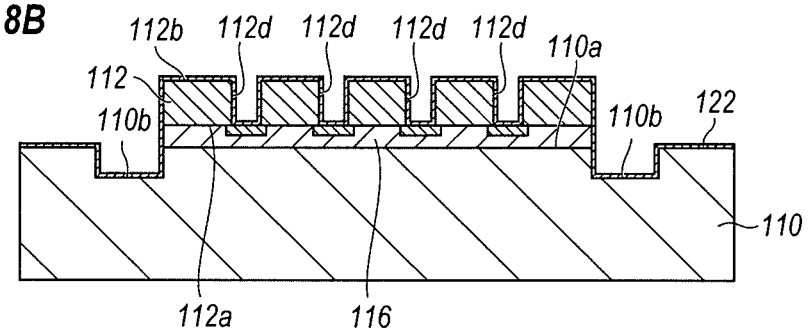
Figure 8C:
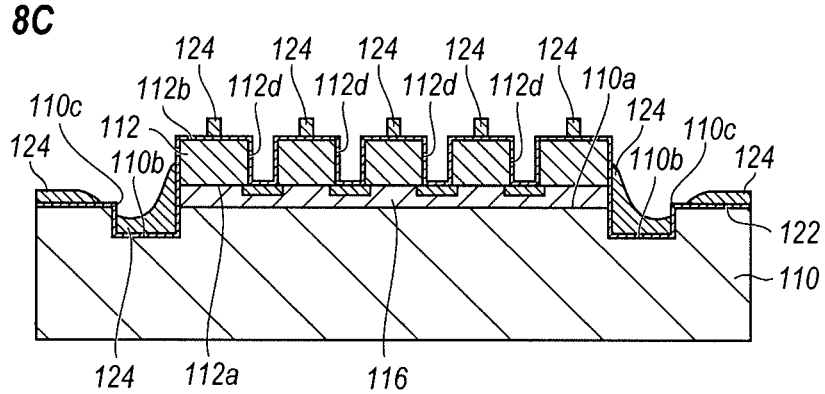

Removing the metal mask 120 (FIG. 8A), the process forms the second seed metal film 122 on the whole back surface 112b of the wafer including the inner surface of the via holes 112d and the primary surface 110a of the substrate 110 (FIG. 8B). Then, the second resist pattern 124 is formed on the back surface 112b of the wafer 112 (FIG. 8C). The second resist pattern 124 is for the interconnections in the back surface of the wafer 112. Specifically, coating a positive photoresist on the whole back surface 112 of the wafer and the primary surface 110a including the groove 110b of the substrate 110, carrying out the photolithography process for the positive photoresist on the surface 112b of the wafer 112, the process may form the resist patterns 124 for the interconnections in the back surface 112b of the wafer 112.

Figure 9A:
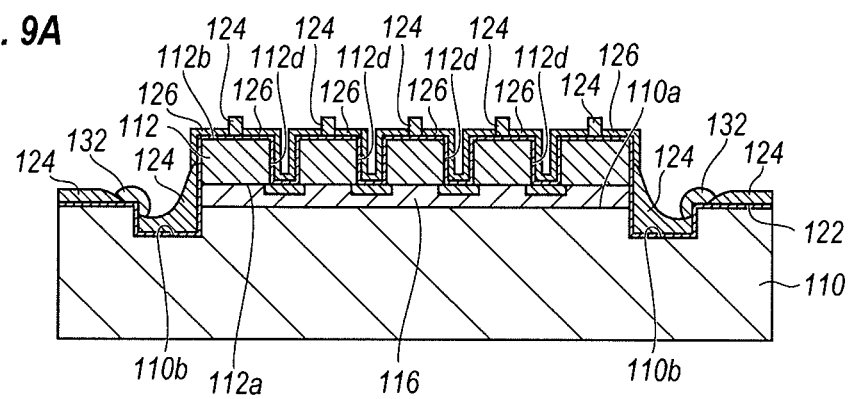
FIGS. 9A to 9C show cross sections of the semiconductor device during the comparative process subsequent to that shown in FIG. 8C.
Figure 9B:
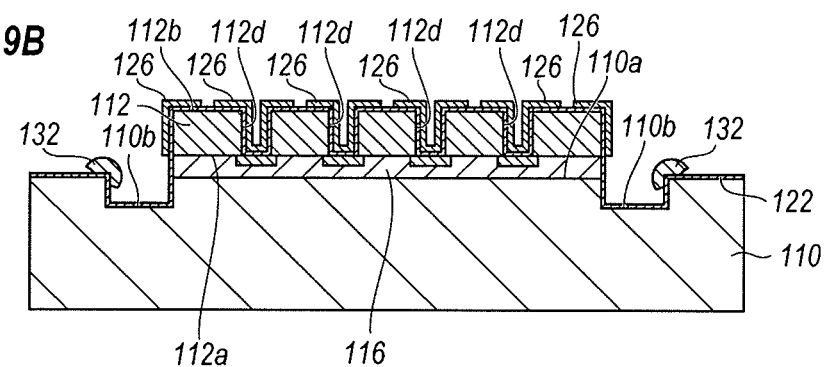

When the groove 110b has a depth comparable to or greater than a thickness of the coated positive photoresist, the coated positive photoresist may not securely cover the edge 110c of the groove 110b, which is schematically illustrated in FIG. 8C. That is, the edge portion 110c of the groove 110b, and that of the primary surface 110a of the substrate 110 expose the second seed metal film 122 thereat. When the subsequent process of the metal plating for forming the back metal 126 is carried out for such a pre-arranged structure, a residual metal 132 is left at the edge portions 110c of the groove 110b (FIG. 9A).

Figure 9C:
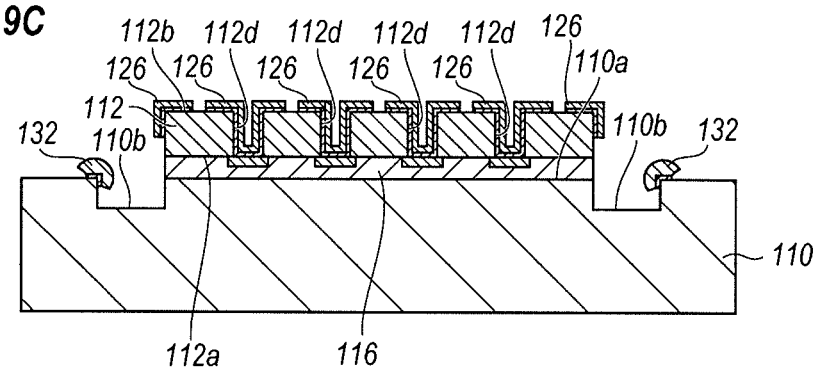

Removing the positive photoresist 124 and portions of the second seed metal film 122 covered by the positive photoresist 124 (FIG. 9B) and now exposed between the metal interconnections 126, as shown in FIG. 9C, the metal residue 132 is still left at the edge portion 110c of the groove 110b.

Figure 10:
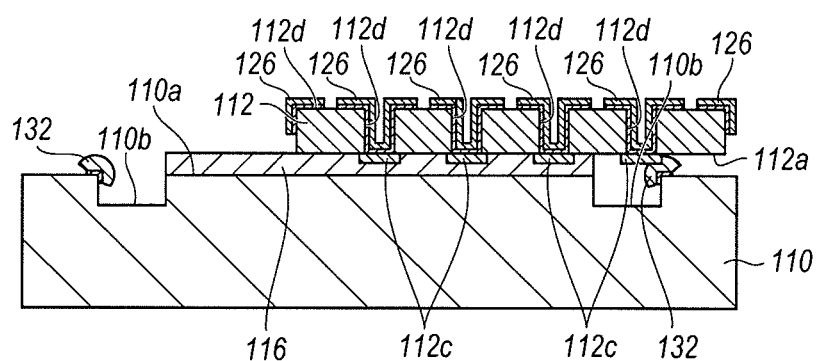
FIG. 10 shows a cross section of the semiconductor device during the comparative process subsequent to that shown in FIG. 9C.

This residual metal 132 causes a failure in the subsequent process to detach the wafer 112 from the substrate 110. Specifically, softening the resin adhesive 116, then sliding the wafer 112 along the surface 112a thereof, the residual metal 132 is caught by the wafer 112 as shown in FIG. 10, which often scratches the interconnection 112c and the surface 112a of the wafer 112.

The process according to the present embodiment described as referring to FIGS. 1A to 5 may leave no resist 24 even when the resist has a large thickness at the periphery of the wafer 12 because the process applies the negative photoresist for forming the metal mask. The process of the invention forms no grooves at the periphery of the wafer 12 and leaves no metal residue at the edge of the groove, thus, the process of the present embodiment may detach the wafer 12 from the substrate 10 without causing any damages on the wafer and scratches to the metal interconnections.

Moreover, the substrate 10 is preferable to be re-used in the process to form via holes in the wafer 12. When the groove 110b is formed as shown in the comparative process, the substrate 10 becomes inadequate for the reuse. On the other hand, the process according to the present invention may use the substrate 10 again and again because the process forms no grooves.

In the foregoing detailed description, the process of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A process to form a via hole in a semiconductor wafer, comprising steps of:
   preparing a metal mask by sequential steps of,
      coating a negative photoresist on a back surface of the semiconductor wafer,
      performing a photolithography to the negative photoresist to form a patterned photoresist, wherein the photolithography leaves no residual photoresist in a periphery of the semiconductor wafer,
      plating a metal selectively by the patterned photoresist, and
      removing the patterned photoresist to form the metal mask by the plated metal;
   etching the semiconductor wafer by using the selectively plated metal as an etching mask to form the via hole;
   removing the selectively plated metal; and
   depositing another metal on an inner surface of the via hole.

2. The process of claim 1, further including a step of, before the step of preparing the metal mask, putting the semiconductor wafer a support substrate such that a primary surface of the semiconductor wafer faces the support substrate.

3. The process of claim 2,
   further including a step of, after the step of etching the semiconductor wafer, detaching the semiconductor wafer from the support substrate by sliding the semiconductor wafer along a surface of the support substrate.

4. The process of claim 1,
   wherein the step of etching the semiconductor wafer includes a step of dry-etching using one of an ICP etching or an ECR etching.

5. The process of claim 1,
   wherein the semiconductor wafer includes one of Si, SiC, sapphire, quartz, or GaN.

6. The process of claim 1, wherein the selectively plated metal includes one of Ni, Cr, or Cu.

7. The process of claim 2,
   wherein the support substrate includes a glass selected from a group of $Al_2O_3$, silica ($SiO_2$) or SiC.

8. A process to form a via hole in a semiconductor wafer, comprising steps of:
   putting the semiconductor wafer on a support substrate such a primary surface of the semiconductor wafer faces the support substrate;
   preparing a metal mask by sequential steps of,
      coating a negative photoresist on a back surface of the semiconductor wafer,
      performing a photolithography to the negative photoresist, to form a patterned photoresist, wherein the photolithography leaves no residual photoresist in a periphery of the semiconductor wafer,
      plating a metal selectively by the patterned photoresist, and
      removing the patterned photoresist to form the metal mask by the plated metal; and
   etching the semiconductor wafer by using the selectively plated metal as an etching mask to form the via hole.

9. The process of claim 8,
   further including a step of, after the step of etching the semiconductor wafer, detaching the semiconductor wafer from the support substrate by sliding the semiconductor wafer along a surface of the support substrate.

10. The process of claim 8,
    wherein the semiconductor wafer includes one of Si, SiC, sapphire, quartz, or GaN.

11. The process of claim 8,
    wherein the selectively plated metal includes one of Ni, Cr, or Cu.

12. The process of claim 8,
    wherein the support substrate includes a glass selected from a group of $Al_2O_3$, silica ($SiO_2$), or SiC.

13. A process to form a via hole in a semiconductor wafer, comprising steps of:
    preparing a metal mask by sequential steps of,
       coating a negative photoresist on a back surface of the semiconductor wafer,
       performing a photolithography to the negative photoresist to form a patterned photoresist, wherein the photolithography leaves no residual photoresist in a periphery of the semiconductor wafer,
       plating a metal selectively by the patterned photoresist, and
       removing the patterned photoresist to form the metal mask by the plated metal; and
    etching the semiconductor wafer by using the selectively plated metal as an etching mask to form the via hole, the etching being carried out by dry-etching using one of an ICP etching or an ECR etching.

14. The process of claim 13, wherein the semiconductor wafer includes one of Si, SiC, sapphire, quartz, or GaN.

15. The process of claim 13, wherein the selectively plated metal includes one of Ni, Cr, or Cu.

* * * * *